United States Patent [19]

Holtzman et al.

[11] Patent Number: 4,715,894

[45] Date of Patent: Dec. 29, 1987

[54] USE OF IMMERSION TIN AND TIN ALLOYS AS A BONDING MEDIUM FOR MULTILAYER CIRCUITS

[75] Inventors: Abraham M. Holtzman, Bat Yam; Joseph Relis, Ramat Gan, both of Israel

[73] Assignee: Techno Instruments Investments 1983 Ltd., Bat-Yam, Israel

[21] Appl. No.: 770,842

[22] Filed: Aug. 29, 1985

[51] Int. Cl.$^4$ ............................................. C23C 18/46
[52] U.S. Cl. .................................. 106/1.22; 106/1.25; 106/1.26; 106/1.27; 106/1.29
[58] Field of Search ................... 106/1.22, 1.25, 1.26, 106/1.27, 1.29

[56] References Cited

U.S. PATENT DOCUMENTS

| | | | |
|---|---|---|---|
| 2,282,511 | 5/1942 | Bradley | 117/130 |
| 3,303,029 | 2/1967 | Shipley | 106/1.25 |
| 3,741,905 | 6/1973 | Saubestre et al. | 252/142 |
| 3,875,029 | 4/1975 | Rosenberg et al. | 204/435 |
| 4,084,022 | 4/1978 | Tratz et al. | 427/96 |
| 4,316,322 | 2/1982 | Tranberg et al. | 29/852 |

FOREIGN PATENT DOCUMENTS 1425743  3/1972  United Kingdom .
2030781  8/1979  United Kingdom .

OTHER PUBLICATIONS

Communication from European Pat. Office EP No. 86306655.1 including European Search Report (and "annex" thereto).

Derwent Publication, Acc. No. 80-67141c/38, Russian Pat. No. 712-455, Jan. 30, 1980.

*Primary Examiner*—Robert Wax
*Attorney, Agent, or Firm*—Scully, Scott, Murphy & Presser

[57] ABSTRACT

A novel immersion tin composition is disclosed containing both thiourea compounds and urea compounds. A method for improving the adhesion of printed circuit boards to one another in a multilayer board and for minimizing or eliminating smear in a multilayer board is also disclosed comprising coating the metal layers of the individual circuit boards with an immersion tin coating prior to laminating them to form a multilayer board.

16 Claims, No Drawings

USE OF IMMERSION TIN AND TIN ALLOYSD AS A BONDING MEDIUM FOR MULTILAYER CIRCUITS

DESCRIPTION

1. Technical Field

The field of the invention is printed circuit boards and a method for improving the manufacture of such boards by employing a tin immersion coating. Improved adhesion of laminae in a multilayer board, better through hole plating and substantial elimination of smear are obtained by employing an immersion tin coating. A novel immersion tin coating is also disclosed.

2. Prior Art

Methods for improving the adhesion of metallic layers to non-conducting surfaces of printed circuit boards in a multilayer board are disclosed by Luce, et al., in U.S. Pat. No. 3,585,010; Berdan, et al., U.S. Pat. No. 4,260,449 and Torday, et al., U.S. Pat. No. 4,469,567. Luce, et al., disclose the production of circuit board laminates employing a copper foil conductor treated by electrodepositing a thin metal layer on it. The metal consists of indium, zinc, tin, nickel, cobalt, brass, or bronze. These metals optionally may be deposited on the surface of the copper by vapor deposition.

Immersion tin coatings are disclosed by Orio, et al., British Patent No. 2,072,709; Shipley, et al., U.S. Pat. No. 3,303,029 and the various references cited in Orio, et al., and Shipley, et al.

SUMMARY OF THE INVENTION

The present invention relates to a novel immersion tin composition comprising:
(a) a thiourea compound
(b) a urea compound
(c) a chelating agent
(d) a reducing agent
(e) an acid and
(f) a tin salt The invention also relates to a process for improving the adhesion of a metal layer of a printed circuit board to the non-conductive surface of a circuit board comprising coating the metal layer with an immersion tin composition especially the composition of the invention. By eliminating the black copper oxide layers of the prior art as an adhesion promoting layer, better through hole plating is realized.

By coating the metal layers of a multi layer circuit board with an immersion tin composition prior to drilling through holes in the board, smear in the holes is eliminated or substantially eliminated thereby minimizing or eliminating the etch-back treatment of the through-hole. Although the inventors do not wish to be limited by any theory, it is believed that the tin acts as a lubricant and to dissipate heat during the drilling of the holes. The composition of the invention is especially useful for this purpose.

DETAILED DESCRIPTION

The present invention relates to a novel immersion tin composition and its use in the manufacture of printed circuit boards. Printed circuit boards (PCB's) comprise a non-conducting or dielectric base made up of a fibrous material such as glass fibers, paper and the like, impregnated with a resinous material such as an epoxy or phenolic resin. The board is clad with a metal conductive layer such as copper on either one or both surfaces.

Multilayer boards (MLB's) comprise several circuit boards laminated to one another by means of an adhesive. In addition to rigid boards (as described above), flexible boards can be produced employing thermoplastic dielectric layers such as fluorocarbon polymers, Nylon polymers, polyimides, polyparabanic acids, and polyesters. Production of these types of printed circuit boards are described in *Printed Circuits Handbook*, Second Edition, edited by C. F. Coombs, Jr. McGraw-Hill, 1979, which is incorporated herein by reference. Laminated combinations of flexible and rigid boards are also finding utility in some more recent applications for MLB's. The present invention applies to all of these structures.

In the manufacture of PCB's, a metal conductive foil such as copper is bonded to the circuit board, although for the purposes of the present invention any metal applied to a non-conductive dielectric circuit board as a foil or by electro deposition, electroles deposition.

Prior to laminating, the metal surface is treated in an art known manner to produce electrically-conductive lines (circuits) for the transfer of current between components of an electrical circuit, the components comprising by way of example, diodes, transistors, resistors, capacitors, and the like. The circuits may be formed either by a positive or a negative working photo resist, silkscreen resist, or hand painted resist process followed by etching and in some instances, electrodeposition of a metal or metals, all of which is known in the art.

The circuits of the inner layers of an MLB are formed by a print and etch process in which a positive working photo resist is applied to the metal layer, a positive circuit image projected onto the resist, followed by a developing process to leave a positive resist pattern. The positive resist pattern can also be formed by a negative working photo resist through which a negative circuit image is projected. The board is then etched after which the positive resist is removed. The elements of the circuit obtained do not have to be electrically connected to one another. These circuits elements that are not connected are placed on the board for subsequent connection to other boards in the MLB array.

In MLB's, the circuit of one board is connected to the circuit of one or more of the other boards in the multilayers. This is achieved by forming pads or circular areas of metal at a point or points on the conductive line or lines of the board. The pads may also be isolated from the conductive lines. The other board or boards that are to be connected are similarly provided with pads and in the laminating process the pads of the different boards are aligned over one another.

In forming MLB's by laminating, a prepreg is inserted between the surfaces of the boards that are to be laminated after which the multiple layers are further treated by applying heat and pressure to them. The prepreg generally comprises a woven or non-woven layer or layers of fibers such as glass, cellulose (e.g. paper), and the like, glass being preferred. The prepreg also is impregnated with a so-called "B-stage" resin such as an epoxy resin that has been partially cured. Art known equivalents of epoxy resins are also employed as adhesives such as acrylic resins (used with polyimide circuit boards) or polyester resins.

The MLB is then pressed and cured with the pads of the circuits of the different boards that are to be connected aligned over one another. After curing, the pads of the MLB's are drilled. The diameter of the drill is considerably less than the diameter of the pad, the ratio of diameters between the pad and the drill being 2:1 or greater so that the overall structure comprises at a minimum a pad from one board aligned over a pad from another board with a hole passing through them. Since the hole in cross-section ideally presents a surface of alternating layers of the pads of the individual PCB's separated by the non-conductive base, an electrically conductive element has to be employed in the hole to form an electrical connection between the pads. This is done by a process known in the art as through hole plating (PTH).

PTH processes are also employed for connecting two metal conductive surfaces having a single non-conductive or dielectric board interposed between them for the formation of a PCB. Boards of this type and the formation of through holes in such boards are also within the scope of the present invention and are intended to be included within the broad definition of the MLB's as that term is used throughout the specification.

Electroless copper is employed as a PTH plating material. Standard electroless copper plating solutions known in the art are used for this purpose. In order to promote the deposition of electroless copper on a non-conductive surface, the non-conductive surface is treated with a stannous chloride sensitizer solution followed by a super sensitizer solution of di-valent palladium chloride. The stannous chloride is oxidized to stannic chloride and the palladium chloride reduced to palladium metal. A preferred method is to employ an activator comprising colloidal palladium containing stannic tin. Stannic tin forms a protective colloid around the metallic palladium, and the solution implants a precious metal site on the non-conductive surface for the purpose of initiating the deposition of the copper by chemical reduction. A postactivator is then employed, generally an acid, to solubilize the protective colloid and expose the precious metal, i.e. palladium. The subsequently applied electroless copper coating solution contains a reducing agent such as formaldehyde, and when in the presence of palladium reduces the cupric ions in the solution to copper metal. The copper metal plates out on the surface of the through hole, making electrical contact with the walls of the metal pads through which the hole is drilled. The electroless copper may have subsequent metal coatings applied to it by electrolytic means.

Because the outer conductive metal layer of an MLB is formed as part of the PTH process, a print and etch procedure cannot be employed for forming circuits on this layer. The etching step would remove the plating applied in the through hole and would be self-defeating. For this reason, after the PTH process is completed, a negative circuit pattern is formed on the surface of the MLB by means of a negative working photo resist, a positive circuit image projected onto the resist followed by developing. This leaves a negative photo resist circuit pattern on the board with bare metal exposed corresponding to the area of the circuit. The negative resist pattern can also be obtained by a positive working photo resist through which a negative circuit image is projected. The bare metal corresponding to the circuit is then coated by electrolytic means with a second metal that acts as an etch-resist. Tin lead alloys are the most common material used in this respect. The etch resist coating also coats the metal surface applied to the through holes in the PTH process. The photo resist is then removed and the board is etched resulting in the formation of a circuit on the outer layer of the MLB having a tin lead coating on the circuit as well as on the walls of the through hole.

One of the difficulties encountered in the prior art manufacture of MLB's is the low bonding strength sometimes obtained between the prepreg and the metal surface of a circuit board in the array of boards that make up the MLB. These problems are especially prevalent when the metal layer comprises copper. The bonding between the copper clad board and the prepreg was improved by etching the copper with amonium persulfate; however, only slightly improved bonding strengths were obtained. Some improved adhesion over the etching process was obtained by pumice spraying to micro-etch the copper surface or provide cavities in the copper surface to which the resin such as the epoxy resin of the prepreg could be bonded to. Other mechanical processes such as brushing similarly provided a mechanical alteration of the surface of the copper to improve the bond strength.

Even better bond strengths between the copper layer and the prepreg were obtained with a so-called black oxide coating in which the copper surface of a PCB was treated with a mixture of sodium hypochlorite and sodium hydroxide to produce a black copper oxide. Although better bond strengths were obtained, one of the difficulties with using this method was that the composition of the sodium hypochlorite/sodium hydroxide solution changed over a period of time and erratic results were obtained such as varying thicknesses of the black oxide. The formation of the black oxide coating was time and temperature dependent and as a result the bath employed for the development of the coating had to be closely monitored. Additionally, prior to the formation of the black oxide coating, the copper surface had to be prepared by brushing, rinsing, and etching either with amonium persulfate or a sulfuric acid-hydrogen peroxide mixture.

It was subsequently discovered that by lowering the sodium hypochlorite/sodium hydroxide bath temperature from 90°–95° C. to 60°–65° C. some economies could be realized in that less heat had to be supplied to the bath, but more importantly the process was easier to control. By employing temperatures of from about 60°–65° C. a bronze or brown colored copper oxide layer was produced on the surface of the copper and slightly better bond strengths were obtained.

It was essential to control the black oxide formation on the surface of the copper since if the oxide was excessively thick, it would shear readily thereby destroying the bond between the copper metal and the prepreg. Additionally at the proper thickness, the black copper oxide was not sufficiently flexible so that it could not be used in a flexible MLB. Even though the brown or bronze colored copper oxides obtained at the 60°–65° C. bath temperatures were easier to control, these coatings were not without their difficulties. Coating of this type were not readily accepted by the purchasers of MLB's since they were mottled or uneven in color and gave the appearance that the coating was not uniform. This mottled appearance or "brown spotting" has been described as affecting the dielectric properties of the resin, and consequently, the overall performance of the printed circuit (Cf. Berdan, et al., U.S. Pat. No. 4,260,449) as well as a lowering of the peel strength of the copper foil (i.e. bonding strength) to the prepreg (Cf. Torday, et al., supra, column 1, lines 27–35).

Torday, et al. (supra) and Luce, et al. (supra), describe methods for overcoming some of the difficulties encountered with the bonding of the copper metal to the prepreg by the electrodeposition or vapor deposition of various alloys or metals to the surface of the copper prior to bonding. One of the difficulties with the deposition of a metal film on the copper is that the processes must be closely controlled to assure that proper metal film thicknesses will be obtained. Skilled operators and constant monitoring of the composition and the conditions of deposition are required in order to obtain uniform thicknesses of these metals on copper.

Even with the prior art processes for treating the copper metal surface to obtain better adhesion to the prepreg, the laminating of the individual circuit boards to form the MLB was a time consuming process. In the laminating process, the individual PCB's assembled in an MLB are placed in a press that is heated to 175° C. held there for about 10–15 minutes to bring the MLB array up to temperature after which a pressure of 250–400 psi is applied. The MLB is held at this temperature and this pressure for approximately 45–50 minutes after which heating is stopped and the MLB allowed to cool for about 10–15 minutes while in the press. After this cooling period, the pressure is released and the MLB is removed from the press.

In subsequent operations after providing through holes and PTH connectors, circuit components are placed on the MLB and soldered to the circuits. Two types of soldering methods are employed one of which comprises a hand soldering process the other of which is an automatic soldering method employing a wave soldering apparatus known in the art in which the bottom of the MLB through which leads of circuit components project are contacted for about 60 seconds with a solder wave that is maintained at a temperature of approximately 290° C. MLB's in which the various laminae are not properly bonded to one another at the interfaces of the copper foil and the prepreg will delaminate when exposed to these soldering conditions.

Smearing is another difficulty encountered in the manufacture of MLB's whereby the drill bit employed to form the hole through the aligned pads in an MLB picks up resinous material and deposits this material on the wall of the hole. Since the wall of the hole contains alternating resinous material layers and metal layers, the surface of the metal layers that form part of the hole wall will be coated with the resinous material thereby preventing any metallic plating material applied to the surface of the hole wall from contacting the metal layers and forming an electrically conductive connection with it. It is believed that the resinous material such as a B-stage epoxy resin used in the prepreg comprises the principle material involved in the smearing of the hole. Smearing, therefore, renders the PTH process ineffective.

The problem of smearing is overcome by a process known in the art as "etch-back" in which a strong mineral acid such as sulfuric acid (optionally containing some hydrofluoric acid) is used to etch away the "smear" from the wall of the hole. Hydrofluoric acid is added to the sulfuric acid to remove any glass fibers from the circuit board that might be projecting into the hole. The glass fiber ends come from the glass fiber battings employed in the manufacture of the circuit boards or prepreg and are removed since they cause imperfections in the surface of the metallic coating applied by the PTH process.

One of the difficulties with the etch-back process is that it requires very careful control in order to prevent excessive etching of the wall of the hole. The concentration and temperature of the etching solution has to be carefully controlled and monitored as well as the length of time over which the etching process is conducted. Again, because of these critical conditions, skilled operators are required to perform this process.

Precise control of the degree of etch-back is critical in order to obtain an acceptable metal coating on the wall of the through hole. In some instances in the etch-back process, the etching solution will remove the resinous layer of the MLB preferentially over the metal or copper layers in the hole. This will result, after etching, in the metal layers projecting slightly beyond the wall of the hole as defined by the surface of the resinous material. If this metal layer projection is excessive, the metal coating applied to the wall of the hole by the PTH process will be uneven and will not make proper electrical contact with the metal layers in the hole.

The phenomenon of the metal layer being etched at a faster rate than the resinous layer in the hole is known as "reverse etch" which in some instances presents the same type of problem encountered where the metal layer projects to far into the hole after etching.

Another difficulty encountered in the prior art PTH process is leaching, in which the black copper oxide formed on the copper foil is deposited as a residue in the through hole during the etch-back procedure. Although after the etch-back process is completed the hole is rinsed, the rinsing process is not effective to remove all of the black copper oxide deposited on the wall of the hole. This causes several problems, the first of which is that the black oxide may interfere with the palladium catalyst deposited on the wall of the hole for promoting the electroless deposition of copper in the PTH process. Secondly, because the black oxide is deposited on the wall as a non-adhering particulate composition, it interferes with the bonding of the electroless copper on the surface of the wall of the hole. Thirdly, black oxide diffuses through the PTH coating resulting in pin holes which interfere with the integrity of the coating by providing sites for the coating to be attacked when the MLB is subjected to etching after the PTH process is completed.

The black oxide layer that forms part of the surface of the wall of the through hole not only contributes to these problems but is also etched away in the etch-back process leaving a void in which etching solution components are trapped. These components are not always removed in the rinsing step and as a result also interfere with the PTH metal layer applied to the through hole.

Blow holes may also form in the PTH coating by the different thermal co-efficients of expansion of the black oxide and the glass material employed in the construction of the circuit boards. The blow holes occur when the board is submitted to extremes of temperature either during the soldering operation or when the boards is in use. Extremes in temperature are also encountered in the through hole after electroless plating of copper when a second metal coating is applied in the PTH process comprising a tin-lead layer that acts as an etch resist. The tin-lead coating is applied electrolytically and subsequently heated or flowed in order to produce a tin-lead coating in the through hole having greater integrity. Pin holes and blow holes in the PTH coating can be the cause of reduced conductivity in the PTH and are to be avoided for this reason.

The use of immersion tin coatings for plating metal surfaces is known. This process does not employ an electric current but is based on an electro chemical displacement reaction. The metal substrate that is to be plated generally is more active (less noble) than the metal salt that is disolved in the coating composition or plating solution. Copper may be plated by a tin solution even though copper is more noble than tin when the immersion coating composition is acidic and contains thiourea as a so-called "complexing" agent. It has been theorized that the relative electrode potentials of tin and copper are reversed under acidic conditions. Once the metal substrate is completely coated, it is no longer available to displace the metal ions in the immersion coating composition.

Some of the limitations of the immersion coating processes were the slow plating speeds, limited thickness of the coating, as well as the extensive degreasing, cleaning and oxide removal pre-coating steps that had to be employed.

The immersion coatings were also porous. The problems of porosity were attempted to be overcome by greater coating thicknesses. Additionally, high coating temperatures (about 82°–85° C.) had to be employed which in some instances caused noxious fumes to be produced from the coating solution and prevented the use of some low cost plastic materials of construction for the plating tank.

Coating times of from 10 to 40 minutes were not uncommon for this process. These times were employed in order to obtain nonporous, relatively thick films on the metal substrate. Additionally, the metal substrate such as a copper substrate employed in circuit boards had to be grease free and oxide free in order to obtain relatively thick tin coatings of 80 millionths of an inch thick after about 40 minutes. (Cf. Shneble, Jr., U.S. Pat. No. 3,917,486).

It is, therefore, an object of the present invention to overcome these and other difficulties encountered in the prior art.

A further object of the present invention is to provide a composition for the treatment of the surface of metal conductive layers of a circuit board and especially a copper layer to promote the adhesion of the metal to a non-conductive surface.

It is a further object of the present invention to provide a process for improving the bond strength between the conductive surfaces and the non-conductive or dielectric layers of an MLB assembly.

It is also an object of the present invention to provide a composition for treating the metal surfaces of a circuit board to be employed in the fabrication of an MLB that will significantly reduce the time and/or laminating temperature used in forming the MLB while maintaining or increasing the bond strength between the layers of an MLB.

It is also an object of the present invention to provide a process for treating the metal surfaces of a circuit board to be employed in the fabrication of an MLB that will significantly reduce the time and/or laminating temperature used in forming the MLB while maintaining or increasing the bond strength between the layers of an MLB.

It is the further object of the present invention to provide a novel composition for reducing or eliminating smearing in an MLB.

It is the further object of the present invention to provide a novel process for reducing or eliminating smearing in an MLB.

It is the further object of the present invention to provide a novel immersion coating composition.

It is the further object of the present invention to provide an adhesion promoting flexible metal coating on the metal surface of a circuit board used in an MLB.

It is also an object of the present invention to provide a novel composition which may be employed in the production of metal immersion coatings.

It is also an object of the present invention to provide an immersion coating that may be applied to a metal surface that is oxidized or partially oxidized.

It is a further object of the invention to provide a novel immersion tin coating composition that simultaneously cleans and coats a metal substrate to which it is applied.

It is the further object of the present invention to provide a novel metal immersion composition that may be employed as a coating composition at room temperatures.

It is the further object of the present invention to provide such an immersion composition that may be employed as a coating material that will deposit a uniform, non-porous coating from about 0.08 to about 0.17 microns.

It is also an object of the invention to provide such a composition that will form a coating in about 30 seconds.

These and other objects have been achieved according to the present invention which relates to an immersion composition, especially an immersion tin composition comprising:

(1-a)

(a) a thiourea compound
(b) a urea compound
(c) a tin salt

The composition may optionally contain:

(1-b)

(d) a chelating agent
(e) a reducing agent and
(f) an acid

The acid is employed to maintain an acid pH which prevents or minimizes any oxidation reactions whereby the tin salt which is preferably a stannous salt could be oxidized to its higher valent form i.e., a stannic salt. Preferred compositions comprise those employing components (a) through (f) as listed above and those optionally containing (1-c) the salt of another metal (as noted herein) and (1-d) a surfactant.

It has also been found that the aforesaid composition can be employed as a coating composition to improve the adhesion of a metal substrate of a PCB to a non-conductive surface of a circuit board and also eliminates, substantially eliminates or minimizes smearing when through holes are drilled in an MLB. Other immersion tin compositions can be employed in this aspect of the invention e.g. such as those disclosed in the U.S. Pat. Nos. to Shipley, 3,303,029; Ceresa, et al., 2,891,871; Sullivan, et al., 2,369,620; and Bradley, 2,282,511.

By employing an immersion tin composition and especially the composition of the present invention in the manufacture of an MLB, problems of pin holes and blow holes are eliminated, or substantially eliminated in the PTH coating.

The essential feature of the composition of the present invention is the use of the combination of a thiourea compound and a urea compound in an immersion coating. It has been found that when using this combination that bright, uniform, non-porous thin coatings of tin or tin alloys can be applied to a metal substrate. Tin or tin alloy coatings from about 0.08 to about 0.17 microns are obtained that have good solderability and are good etch-resists because they are substantially non-porous.

The combination of the thiourea compound and urea compound allow coating of metal substrates with substantially no pre-cleaning or minimal pre-cleaning. The composition of the invention acts as a cleaning composition to some degree and in many instances can be applied directly on to a metal substrate without pre-cleaning.

By way of example the immersion tin coating of the invention, optionally containing a nickel salt and a surfactant was applied to a copper surface that had a slight oil film, fingerprints and areas of copper oxide without any pre-cleaning of the copper surface or oxide removal. After about 15 seconds, a bright, well adhered tin nickel coating was obtained on the entire copper surface.

Thus the novel tin immersion coating comprising the combination of the thiourea composition and urea composition has been found to act as a cleaner and degreaser for the metal substrate over which the coating is applied. Extensive oil and/or grease removal and a scrubbing of the metal substrate to remove metal oxides is either substantially reduced or eliminated. The coating composition will deposit a tin layer on a metal oxide surface such as copper oxide.

The immersion tin coatings of the invention have been similarly applied to gold and aluminum metal substrates and substantially the same results obtained. The application of the coating therefor appears to be independent of the reduction potentials of the metal substrates that are coated.

The components of the composition are present in the following amounts on a molar basis:

(2-a)

(a) about 10 to about 125 parts of a thiourea compound
(b) about 10 to about 125 parts of a urea compound
(c) about 1 to about 15 parts of a tin salt.

where the composition optionally contains a chelating agent, a reducing agent and an acid, these components are present in the following amounts on a molar basis:

(2-b)

(d) about 5 to about 40 parts of a chelating agent
(e) about 5 to about 110 parts of a reducing agent
(f) about 1 to about 30 parts of an acid.

The composition optionally may contain the salt of a second metal in the following amounts, on a molar basis:

(2-c)

(g) about 0.2 to about 55 parts of a salt of a Group VIII metal, a Group IVA metal (with the exception of tin) a Group IIB metal and Group IB metal.

A surfactant (2-d) may also be added to the composition in an amount as indicated herein.

In one aspect of the invention a composition is provided comprising:

| (3-a) | Thiourea | 10–100 g/l |
|---|---|---|
| | Urea | 5–80 g/l |
| | Tartaric acid | 5–80 g/l |
| | Glucose | 5–80 g/l |
| | $H_2SO_4$ (36%) | 2–60 ml/l |
| | $SnSO_4$ | 1–30 g/l |

Similarly where a combination of tin and another metal is to be coated such as nickel the composition will have the following components added to it:

| (3-b) | Triton X-100 | 0.5–10 ml/l |
|---|---|---|
| | $NiSO_4$ | 5–80 g/l. |

In one embodiment, a coating composition is prepared comprising the following:

| (4) | Thiourea | 60 g/l |
|---|---|---|
| | Urea | 40 g/l |
| | Tartaric Acid | 40 g/l |
| | Glucose | 40 g/l |
| | $H_2SO_4$ (36%) | 30 ml/l |
| | $SnSO_4$ | 20 g/l |
| | Triton X-100[1] (optional) | 5 ml/l |
| | $NiSO_4$ (optional) | 40 g/l |
| | Water | balance |

[1] non-ionic polyoxyethylene nonyl phenol surfactant.

Coating compositions containing about 60 g/l thiourea; about 40 g/l urea; about 40 g/l $NiSO_4$ and the balance water have been prepared and can form immersion tin coatings on a copper substrate.

The various equivalents as set forth herein for the foregoing components of formulas (1-a) through (1-d); (2-a) through (2-d); (3-a) and (3-b); and as known in the art may be substituted for such components on an equimolar basis.

Various combinations of tin and other metals may be used in the composition as soluble salts e.g. water soluble salts based on mineral acid or organic acid salts of these metals. The metals that may be used with tin include the soluble e.g. water soluble salts of a metal taken from Group VIII, Group IB, Group IIB and Group IVA (with the exception of tin) of The Periodic Table of the Elements and mixtures thereof. Thus, in addition to tin nickel, tin lead or tin mercury coatings, may be deposited by means of the immersion composition of the invention.

Additionally, other immersion compositions, useful for plating metal surfaces are prepared by substituting other soluble, e.g., water soluble metal salts for tin of formulas (1-a) through (1-d); (2-a) through (2-d); (3-a) and (3-b); and (4), these other metal salts comprising those based on the metals of Group IVA; VB; VIB; VIIB; IB; IIB and IIIA of the Periodic Table of the Elements; the group IVA, VIII, IB, IIB and IIIA metals being preferred; and the Group IVA, VIII and IB metals being especially preferred. As referred to in the immediately preceding description, the Group IVA metals are intended to include the Group IVA metals with the exception of tin. The anions of these metal salts are the same as those defined herein for the tin salts. Additionally, the metal salts as defined above and herein are preferably employed in their lowest oxidation states e.g., Sn(2); Ni(2); Hg(1); Au(1) and the like. Various mixtures of these other metal salts may also be employed. Salts of lead, mercury, silver, indium, gold and palladium are especially suitable.

The tin coating compositions of the invention are useful as an etch resist in lieu of eletrolytic tin lead etch resists used in the manufacture of an MLB as described herein.

The foregoing tin immersion coating provides many advantages over the coatings employed in the prior art especially the tin immersion coatings of the prior art. Thinner pore free coatings are obtained i.e. coatings of about 0.08 to about 0.175 microns compared to the prior art in which 1-2 micron coatings (40-80 millionths of an inch) are utilized to obtain pore free coatings.

The composition of the present invention will produce coatings of from about 0.001 to about 0.175 microns and especially from about 0.05 to about 0.175 microns. The coating times will vary from any where between about 2 seconds up to 5 minutes (especially 5 seconds to about 120 seconds), suitable coatings (about 0.065 microns) being obtained at about 30 seconds. The coating temperatures may vary any where from about 0° to about 30° C., especially from about 15° to about 25° C. although higher temperatures may also be employed.

Excellent adhesion of the inner layers of an MLB are obtained when the metal surfaces of the inner layers are coated with the immersion tin coating of the present invention prior to laminating. No delamination of an MLB prepared in such a manner was noted after exposure of the MLB to a temperature of 290° C. for 10-60 seconds.

In addition to eliminating or substantially eleminating smearing in the through hole of an MLB, by acting as a lubricant for the drill bit as well as a heat dissipating material, the immersion tin coating of the invention also reduces the bonding times and/or temperatures employed in making the MLB. Typically, by coating the inner layers of an MLB prior to laminating with the tin immersion coating, the preheat step in the MLB laminating process may be eliminated and the laminating time reduced to about 5 to about 30 minutes from the standard 45 minute cycle ordinarily required for this step. Pin holes and blow holes in PTH coatings are also substantially eliminated or minimized when employing the coating to promote adhesion of a prepreg to a metal layer in an MLB.

Because the immersion tin coating layer is used in lieu of a black copper oxide layer to promote adhesion to the prepreg, excessive etching of the adhesion-promoting layer is avoided with all of the problems associated with it in the etch-back and PTH processes. The immersion tin layer is substantially unaffected in an etch-back process as compared to the black oxide layer.

Although various other metals may be deposited with the tin in the novel immersion coating, it is preferred to use a nickel salt such as nickel sulfate in the coating composition when the coating layer is to be plated with another metal. The other Group VIII metals may also be employed in this aspect of the invention as well as the Group IB metals IIB metals and the Group IVA metals (with the exception of tin) and mixtures thereof. The thiourea compounds and urea compounds of the present invention may be represented by the formula:

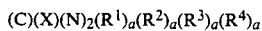

where
$R^1 =$
(1) H
(2) alkyl or alkenyl having up to about 6 carbon atoms
(3) aryl, aralkyl, or alkaryl having up to about 12 carbon atoms
(4) cycloalkyl, cycloalkylalkyl, or alkylcycloalkyl having up to about 12 carbon atoms
(5) $R^5(CO)$ where $R^5$ may be the same as radicals (2) through (4) as defined above for $R^1$
(6) $CH_2OH$
(7) $(C)(X)(N)_2 (R^1)_a(R^2)_a(CO)_2$
(8) $(C)(X)(N)_2 R^1 R^2 R^3$
(9) $(C)(X)(N) R^1 R^2$
(10) $(C)(X)(N)_2 R^1 R^2 (CO)$ $R^2$, $R^3$ and $R^4$ may be the same as radicals (1) through (6) as defined above for $R^1$.
$a = 1$ or $0$ For the thiourea compounds and their analogs employed according to the present invention $X = S$, Se or Te; X preferably is S.

For the urea compounds employed according to the present invention, $X =$ oxygen.

Mineral acid salts of the thiourea and urea compounds may also be used.

The thiourea compound of the present invention comprises either thiourea or the various art known derivatives, homologs, or analogs thereof. Compounds that may be employed in this respect comprise 2,4-dithiobiuret; 2,4,6-trithiotriuret; alkoxy ethers of isothiourea; thiocyanuric acid (trimer of thiourea); thioammelide (trimer of thiourea); monalkyl or dialkyl thiourea, where the alkyl group comprises a lower alkyl group, having up to about four carbon atoms such as diethyl thiourea or monoethyl thiourea; saturated or unsaturated cyclic hydrocarbons mono- or disubstituted thioureas such as naphthyl thiourea, diphenyl thiourea, cyclohexyl thiourea and the like, where the cyclic hydrocarbons has up to about ten carbon atoms; the disulfide of thiourea; thio-imidol (the reaction product of thiourea and sodium hydroxide); thiocarbamic acid esters (the reaction products of thiourea and an alcohol comprising ROH where R is a saturated or unsaturated aliphatic or cyclic group having up to about ten carbon atoms) the oligomers of thiourea and formaldehyde, e.g. monomethylol, dimethylol, and trimethylol thioureas; S-alkyl pseudo thioureas (manufactured by the reaction of thiourea with an iodo lower alkane such as iodo methane where the lower alkyl group contains up to about five carbon atoms); thiocarbonic acid esters of thiourea and $R^5OH$, ($R^5$ as defined above) especially where $R^5$ is lower alkyl; thioureadioxide (aka formamidinesulfinic acid [1758-73-2, C.A.Reg.No.]); the reaction product of a saturated or unsaturated aliphatic or cyclic organic acid having up to about 12 carbon atoms and especially the lower aliphatic monocarboxylic acid reaction products with thiourea e.g. acylthioureas, and the mineral acid salts of thiourea e.g. thiourea mono- or di-sulfate.

Similarly, the urea compound comprises either urea or the various substituted ureas or urea reaction products such as biuret; monoalkyl or dialkyl urea, where the alkyl group comprises a lower alkyl group having up to about four carbon atoms such as diethyl urea or monoethyl urea; saturated or unsaturated cyclic hydrocarbon mono- or disubstituted ureas where the cyclic hydrocarbon has up to ten carbon atoms, such as naphthyl urea, diphenyl urea, cyclohexyl urea and the like; alkoxy ethers of iso-urea especially lower alkoxy ethers of iso-urea where the lower alkyl group contains up to about five carbon atoms, these products being manufactured by the reaction of a lower alkanol with cyanamide hydrochloride; acid derivatives of urea in which the hydrogen atom of urea is substituted by an acyl group, these compounds sometimes being referred to as ureides obtained by the reaction of urea with a monocarboxylic aliphatic saturated or unsaturated organic acid having to about 20 carbon atoms and especially those acids having up to about four carbon atoms; the mineral acid salts of urea e.g. urea mono- or disulfate; triuret; cyanuric acid (a trimer of urea); ammelide (a trimer of urea); imidol; carbamic acid esters of urea and $R^5OH$, (where $R^5$ is defined above) especially alkyl carbamates made by the reaction product of an organic alcohol with urea especially an alkanol such as a lower alkanol containing up to about four carbon atoms; monomethylol urea, dimethylol urea, trimethylol urea and other oligomers of urea and formaldehyde. The various substituted ureas and their use in immersion coatings is further disclosed by Ceresa, et al., in U.S. Pat. No. 2,891,871 which is incorporated herein by reference.

Other urea and thiourea compounds that may be employed comprise:
urea nitrate;
urea oxalate;
urea phosphate;
urea sulfate;
1-acetylurea;
1-acetyl-3-methylurea;
1-acetyl-2-thiourea;
S-acetyl-2-thiourea hydrochloride;
1-allylurea;
1-allyl-3-phenylurea;
1-allyl-2-thiourea;
1-(4-aminobenzenesulfonyl)urea;
1-(4-aminobenzenesulfonyl)-2-thiourea;
1-benzoylurea;
1-benzoyl-2-thiourea;
1-benzylurea;
1-benzyl-2-thiourea;
1,3-bis(2-ethoxyphenyl)urea;
1,3-bis(4-ethoxyphenylurea;
1,3-bis(2-4-dinitrophenyl)urea;
1-3-bis-(hydroxymethyl)urea;
1,3-bis(1-hydroxy-2,2,2-trichloroethyl)urea;
1(2-bromo-2-ethylbutanoyl)urea;
1(2-bromo-3-methylbutanoyl)urea;
1(2-bromophenyl)urea;
1(3-bromophenyl)urea;
1(4-bromophenyl)urea;
1-butylurea;
1-sec-butylurea;
1-tert-butylurea;
1-butyl-3-phenyl-2-thiourea;
1(2-chlorophenyl)urea;
3(4-chlorophenyl)-1,1-dimethylurea;
1(2-chlorophenyl)-2-thiourea;
1(4-chlorophenyl)-2-thiourea;
1,3-diacetylurea;
1,1-diethylurea;
1,3-diethylurea;
1,3-diethyl-1,3-diphenylurea;
1,3-diethyl-1,3-diphenyl-2-thiourea;
1,3-diethyl-2-thiourea;
1,1-dimethylurea;
1,3-dimethylurea;
1,3-dimethyl-1,3-diphenylurea;
1,3-dimethyl-2-thiourea;
1,1-di(2-naphthyl)urea;
1,3-di(1-naphthyl)urea;
1,3-di(2-naphthyl)urea;
1,3-di(1-naphthyl)-2-thiourea;
1,3-di(2-naphthyl)-2-thiourea;
1,1-diphenylurea;
1,3-diphenylurea;
1,3-diphenyl-1-methylurea;
1,3-diphenyl-S-methyl-2-thiourea;
1,1-diphenyl-2-thiourea;
1,3-diphenyl-2-thiourea;
1,1-dipropyl-2-thiourea;
1,3-dipropyl-2-thiourea;
1,3-diisopropyl-2-thiourea;
1,3-di(2-tolyl)-2-thiourea;
1,3-di(4-tolyl)-2-thiourea;
1(3-ethoxyphenyl)urea;
1(4-ethoxyphenyl)urea;
1-ethylurea;
1-ethyl-1-phenylurea;
1-ethyl-3-phenylurea;
1-ethyl-3-phenyl-2-thiourea;
1-ethyl-2-selenourea;
1-ethyl-2-tellurourea;
1-ethylidene-2-thiourea;
1-hydroxyurea;
1(hydroxymethyl)urea;
1(2-iodo-3-methylbutanoyl)urea;
isobutylurea;
1(2-isopropyl-4-pentenoyl)urea;
1(4-methoxy-phenyl)urea;
1-methylurea;
1(2-methyl-2-butyl)urea;
1(3-methyl-butyl)urea;
1-methyl-3(1-naphthyl)-2-thiourea;
1-methyl-1-nitrosourea;
1-methyl-3-phenyl-2-thiourea;
S-methyl-2-thiourea;
S-methylisothiouronium iodide;
S-methylisothouronium nitrate;
S-methylisothiouronium sulfate;
1-methyl-2-thiourea;
1(1-naphthyl)urea;
1(2-naphthyl)urea;
1(1-naphthyl)-3-phenyl-2-thiourea;
1(1-naphthyl)-2-thiourea;
1(2-naphthyl)-2-thiourea;
1-nitrourea;
1-oxalylurea;
1(2-phenoxy-ethyl)urea;
1-phenylurea;
1(phenyl-acetyl)urea;
1-phenyl-2-thiourea;
S-phenyl-2-thiourea;
1-propylurea;
2-selenourea;
2-tellurourea;
1(sulfonamylphenyl)urea;
1,1,3,3-tetraethylurea;
1,1,3,3-tetramethylurea;
1,1,3,3-tetramethyl-2-thiourea;
1,1,3,3-tetraphenylurea;
1,1,3,3-tetraphenyl-2-thiourea;
2-thio-1(2-tolyl)urea;

2-thio-1(3-tolyl)urea;
2-thio-1(4-tolyl)urea;
2-thio-1,1,3-trimethylurea;
2-thio-1,1,3-triphenylurea;
1(2-tolyl)urea;
1(3-tolyl)urea;
1(4-tolyl)urea;
1,1,3-trimethylurea;

Some especially preferred thiourea compounds in addition to thiourea that may be employed according to the invention comprise:
phenylthiourea;
naphthylthiourea;
thiourea disulfide;
oligomers of thiourea and formaldehyde;
N-allylthiourea;
N-mono-p-tolylthiourea (and the equivalents thereof disclosed in U.S. Pat. No. 4,502,927, incorporated herein by reference);
N-alkylthioureas such as methylthiourea (and the equivalents thereof disclosed in West German Patent No. 3,110,478, incorporated herein by reference);
monophenylthiourea;
metaphenylenedithiourea;
N,N'-ethylenethiourea;
N,N'-dibutyneylthiourea;
N,N'-dibutenylthiourea;
trifluoro acetylthiourea;
isothiourea-S-propionic acid;
amino substituted thioureas such as thio semicarbazide and 1-phenylthiosemicarbazide;
1-aryl-thioureas where the aryl group is phenyl, benzyl or naphthyl;

When substituted urea and thiourea compounds are employed in lieu of urea and thiourea it is preferred that each contain the same substituent. By way of example, if diethylthiourea is used in the composition in lieu of thiourea, diethylurea would be substituted for urea and so forth.

The tin salt of the composition preferably comprises a stannous salt. Although stannous salts of an inorganic (mineral) acid or organic acid may be used according to the invention (e.g. stannous formate, stannous acetate and the like) the tin salt of the present invention may comprise a stannous salt of a mineral acid such as the sulfur, phosphorous, and halogen acids, especially the sulfur acids such as sulfuric acid or sulfamic acid. Alkali metal stannates may also be used such as sodium or potassium stannate and the art known equivalents thereof. In one embodiment of the invention stannous sulfate, stannous sulfamate or stannous acetate is used as the tin salt. Where tin lead coatings are deposited, lead acetate may be used as the lead salt.

The acids that are employed according to the invention may be organic acids or inorganic acids (mineral acids) based on sulfur, phosphorous, or the halogens, the sulfur based mineral acids being preferred such as sulfuric acid or sulfamic acid. Some of the organic acids that may be employed according to the invention comprise monocarboxylic or dicarboxylic acids having up to about six carbon atoms such as formic acid, acetic acid, malic acid, maleic acid, and the like.

It is preferred, if possible not to use halogen acids or halogen salts since halide residues will be produced in the metal coating deposited, these salts interfering with the electrical properties of the metal and may also act as corrosive materials in the coating.

The chelating agents that may be employed generally comprise the various classes of chelating agents and specific compounds disclosed in Kirk-Othmer, *Encyclopedia of Chemical Technology*, Third Edition volume 5, pages 339-368 incorporated herein by reference. Chelating agents that are especially preferred comprise the aminocarboxylic acids and the hydroxycarboxylic acids. Some specific aminocarboxylic acids that may be employed in this respect comprise ethylenediaminetetraacetic acid, hydroxyethylethylenediaminetriacetic acid, nitrilotriacetic acid, N-dihydroxyethylglycine, and ethylenebis(hydroxyphenylglycine). Hydroxy carboxylic acids that may be employed comprise tartaric acid, citric acid, gluconic acid and 5-sulfosalicylic acid.

The various reducing agents that may be employed according to the present invention are well known in the art and generally comprise organic aldehydes whether saturated or unsaturated, aliphatic or cyclic, having up to about ten carbon atoms. Lower alkyl aldehydes having up to about six carbon atoms may be employed in this respect such as formaldehyde, acetaldehyde, propionaldehyde, butyraldehyde, and the like. Especially preferred aldehydes comprise hydroxy aliphatic aldehydes such as glyceral-dehyde; erythrose; threose; arabinose and the various position isomers thereof and glucose and the various position isomers thereof. Glucose has been found to act to prevent oxidation of the metal salts to a higher oxidation state (e.g., SnII to SnIV) but also as a chelating agent and is especially useful for these reasons.

The surfactants that may be employed comprise any non-ionic, anionic, cationic or amphoteric surfactant such as those listed in Kirk-Othmer, *Encyclopedia of Chemical Technology*, Third Edition, Volume 22, pp. 332-387 which is incorporated herein by reference. The non-ionic surfactants are especially preferred.

What is claimed is:

1. An immersion metal composition comprising:
   (a) a thiourea compound
   (b) a urea compound
   (c) a metal salt
said metal salt being selected from the group of salts based on the Group IVA metals including tin, Group VIII metals, Group IB metals, Group IIB metals and Group IIIA metals, said urea compound and thiourea compound each being present in an amount sufficient to enable said compositon to function as an immersion composition.

2. The composition of claim 1 further comprising
   (d) a chelating agent
   (e) a reducing agent
   (f) an acid.

3. The composition of claims 1 or 2 where said metal salt comprises a stannous salt.

4. The composition of claim 2 where said reducing agent comprises an aldehyde reducing agent.

5. The composition of claim 2 where said acid comprises a mineral acid and said metal salt comprises a stannous salt of a mineral acid.

6. The composition of claim 1 where said thiourea compound and said urea compound comprise a thiourea nucleus and a urea nucleus with the same substituents on each of said neclei.

7. The composition of claim 6 where said thiourea compound comprises thiourea and said urea compound comprises urea.

8. The composition of claims 1 or 2 further comprising a compound selected from a member of the group consisting of a Group VIII metal salt, a Group IVA metal salt including tin, a Group IIB metal salt or a Group IB metal salt or mixtures thereof.

9. The composition of claim 3 further comprising a metal salt selected from a member of the group consisting of the salts of iron, cobalt, and nickel or mixtures thereof.

10. The composition of claim 9 where said salt comprises a nickel salt.

11. The composition of claim 3 further comprising a salt of lead.

12. The composition of claim 1 or 2 or 9 further comprising a surfactant.

13. The composition of claims 1 or 2 or 9 further comprising a polyoxyethylene nonyl phenol surfactant.

14. The composition of claims 1 or 2 or 3 where the components of said composition are present in the following amounts on a molar basis:
 (a) about 10 to about 125 parts of a thiourea compound
 (b) about 10 to about 125 parts of urea compound
 (c) about 1 to about 15 parts of a metal salt.

15. The composition of claim 14 further comprising the following components on a molar basis:
 (d) about 5 to about 40 parts of a chelating agent
 (e) about 5 to about 110 parts of a reducing agent
 (f) about 1 to about 30 parts of an acid.

16. The composition of claim 14 further comprising a compound selected from a member of the group consisting of a Group VIII metal salt, a Group IVA metal salt with the exception of tin, a Group IIB metal salt or a Group IB metal salt or mixtures thereof in an amount from about 0.2 parts to about 55 parts on a molar basis and said metal salt comprises a tin salt.

* * * * *